United States Patent [19]

Maruyama

[11] Patent Number: 5,554,927
[45] Date of Patent: Sep. 10, 1996

[54] ELECTRICAL QUANTITY MEASUREMENT DEVICE

[75] Inventor: Ryoji Maruyama, Kanagawa-ken, Japan

[73] Assignee: Kabushiki Kaisha Toshiba, Kawasaki, Japan

[21] Appl. No.: 398,663

[22] Filed: Mar. 3, 1995

[30] Foreign Application Priority Data

Mar. 3, 1994 [JP] Japan .................................... 6-033542

[51] Int. Cl.$^6$ ............................ G01R 33/06; G01R 33/00
[52] U.S. Cl. ...................... 324/117 H; 324/126; 324/142
[58] Field of Search ........................... 324/117 H, 117 R, 324/126, 127, 142

[56] References Cited

U.S. PATENT DOCUMENTS

| | | | |
|---|---|---|---|
| 4,283,643 | 5/1979 | Levin | 307/309 |
| 4,538,258 | 8/1985 | Maruyama | 324/142 |
| 4,698,522 | 10/1987 | Larsen et al. | 307/309 |

FOREIGN PATENT DOCUMENTS

| | | |
|---|---|---|
| 0133695 | 3/1985 | European Pat. Off. . |
| 0386272 | 9/1990 | European Pat. Off. . |
| 0438637 | 7/1991 | European Pat. Off. . |
| WO93/15413 | 8/1993 | WIPO . |

OTHER PUBLICATIONS

Patent Abstracts of Japan, vol. 7, No. 113 (P-197), May 18, 1983, JP-A-58 034 365, Feb. 28, 1983.
Patent Abstracts of Japan, vol. 11, No. 288 (E-542), Sep. 17, 1987, JP-A-62 086 777, Apr. 21, 1987.
Patent Abstracts of Japan, vol. 13, No. 345 (P-909), Mar. 8, 1989, JP-A-01 105 177, Apr. 21, 1989.

*Primary Examiner*—Kenneth A. Wieder
*Assistant Examiner*—Barry C. Bowser
*Attorney, Agent, or Firm*—Oblon, Spivak, McClelland, Maier & Neustadt, P.C.

[57] ABSTRACT

A device for measuring an electrical quantity of a system under measurement including a Hall element equipped with a pair of current input terminals and a pair of voltage output terminals. In the Hall element, four equivalent resistances are formed. The device also includes a device for applying a magnetic field proportional to a value of a first current on the Hall element, and a current supply circuit for flowing a second current between the current input terminals. The device further includes an output circuit for detecting a first voltage appearing between the output voltage terminals and outputting the first voltage as a measured value corresponding to the electrical quantity, and an offset compensation circuit for detecting an offset appearing between the voltage output terminals for varying one of the four equivalent resistances based on the offset thus detected so as to compensate the offset. The device also includes an input resistance control circuit for varying remaining three of the equivalent resistances such that a second voltage generated between the current input terminals caused by a flow of the second current is maintained at a predetermined value. An input resistance value of the Hall element is thereby held constant.

7 Claims, 3 Drawing Sheets

ELECTRICAL QUANTITY MEASUREMENT DEVICE

BACKGROUND OF THE INVENTION

1. Field of the Invention

This invention relates to a device for measuring electrical quantities wherein measurement of electrical quantities such as the current or power of the system under measurement is effected using a Hall element.

2. Description of the Related Art

If the applied magnetic field in a Hall element is made proportional to the current value of a system under measurement, a Hall voltage will be obtained that is proportional to this applied magnetic field and hence to the current value of the system under measurement. Thus a current measurement device can be constructed using such a Hall element. FIG. 4 shows an equivalent circuit of such a Hall element. In this FIG. 1 is a Hall element, T1 and T2 are a pair of current input terminals, and T3 and T4 are a pair of voltage output terminals. Equivalent resistances Ra, Rb, Rc and Rd are respectively formed between, adjacent terminals of these terminals T1–T4. B designates an applied magnetic field. However, if, when magnetic field B is not applied an offset voltage is present between voltage output terminals T3 and T4, this gives rise to a measurement error when a current measurement device or the like is constituted using Hall element 1. The offset is generated when equivalent resistances Ra and Rb are not equal to or equivalent resistances Rc and Rd are not equal to during when magnetic field B is not applied. Consideration has therefore been given to adjusting one of these four equivalent resistances Ra, Rb, Rc and Rd from outside of Hall element 1 such that the offset is reduced to zero, by a well-known method such as a variable resistor is used or a voltage is applied to Hall element 1. One example of compensating the offset is disclosed in Japanese Patent Disclosure (Kokai) No. H6-174765 published on Jun. 24, 1994. For example, using a Hall element 1 equipped with gates G1–G4 as shown in FIG. 5, one equivalent resistance, e.g. Rc, can be controlled by applying a voltage to one of four gates G1–G4. In this case, the usual conventional method was to leave the remaining three equivalent resistances Ra, Rb and Rd without exercising particular positive control over them. An input resistance Rin of Hall element 1 was then Rin=(Ra +Rc)∥(Rb+Rc), wherein the symbol "∥" means the parallel connection.

Previously there was the problem that when fluctuation of the offset occurred due to variation with time or temperature, since compensation was effected by making the offset zero by varying a single equivalent resistance, fluctuation in the input resistance occurred, which produces fluctuation of sensitivity and tends to give rise to measurement error.

SUMMARY OF THE INVENTION

Accordingly, one object of this invention is to provide a device for measuring an electrical quantity of a system under measurement wherein the input resistance value can be held constant even when the compensation of the offset is effected for offset fluctuations.

Another object of this invention is to provide a device for measuring an electrical quantity of a system under measurement wherein the fluctuations of sensitivity can be suppressed and high-accuracy measurement can be achieved with a good temperature characteristic even when the compensation of the offset is effected for offset fluctuations.

These and other objects of this invention can be achieved by providing a device for measuring an electrical quantity of a system under measurement including a Hall element equipped with a pair of current input terminals and a pair of voltage output terminals. In the Hall element, four equivalent resistances are formed between two adjacent terminals of the current input terminals and the voltage output terminal. The device also includes a magnetic field applying device for applying a magnetic field proportional to a value of a first current on the Hall element, and a current supply circuit for flowing a second current between the pair of the current input terminals of the Hall element. The device further includes an output circuit for detecting a first voltage appearing between the pair of the output voltage terminals and outputting the first voltage as a measured value corresponding to the electrical quantity, and an offset compensation circuit for detecting an offset appearing between the pair of the voltage output terminals for varying one of the four equivalent resistances in the Hall element based on the offset thus detected so as to compensate the offset. The device also includes an input resistance control circuit for varying remaining three of the equivalent resistances other than the one equivalent resistance such that a second voltage generated between the pair of the current input terminals caused by a flow of the second current is maintained at a predetermined value. An input resistance value of the Hall element is thereby hold constant.

In the above construction, firstly, the offset appearing between the pair of voltage output terminals when the magnetic field is not applied is detected by the offset compensation means, and the detected offset is compensated so that it becomes zero by varying one equivalent resistance of the four equivalent resistances in the Hall element. Also, simultaneously with this, the input resistance control means is actuated so that the input resistance is controlled to a constant value by varying the three remaining equivalent resistances in such a way that the voltage generated across the pair of current input terminals by a constant-value DC current is maintained at a constant voltage value. In a condition in which such control is applied, the current value of the system under measurement can be measured with high accuracy by reading the voltage, which is directly proportional to the current value of the system under measurement, that is output from the pair of voltage output terminals.

Secondly, offset compensation and, concurrently with this, input resistance constant-value control are performed in practically the same way as described above. In a condition in which such control is applied, the power value of the system under measurement can be measured with high accuracy by reading the voltage, which is directly proportional to the product of the current value and voltage value of the system under measurement, that is output from the pair of voltage output terminals.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

3

Figure 2:
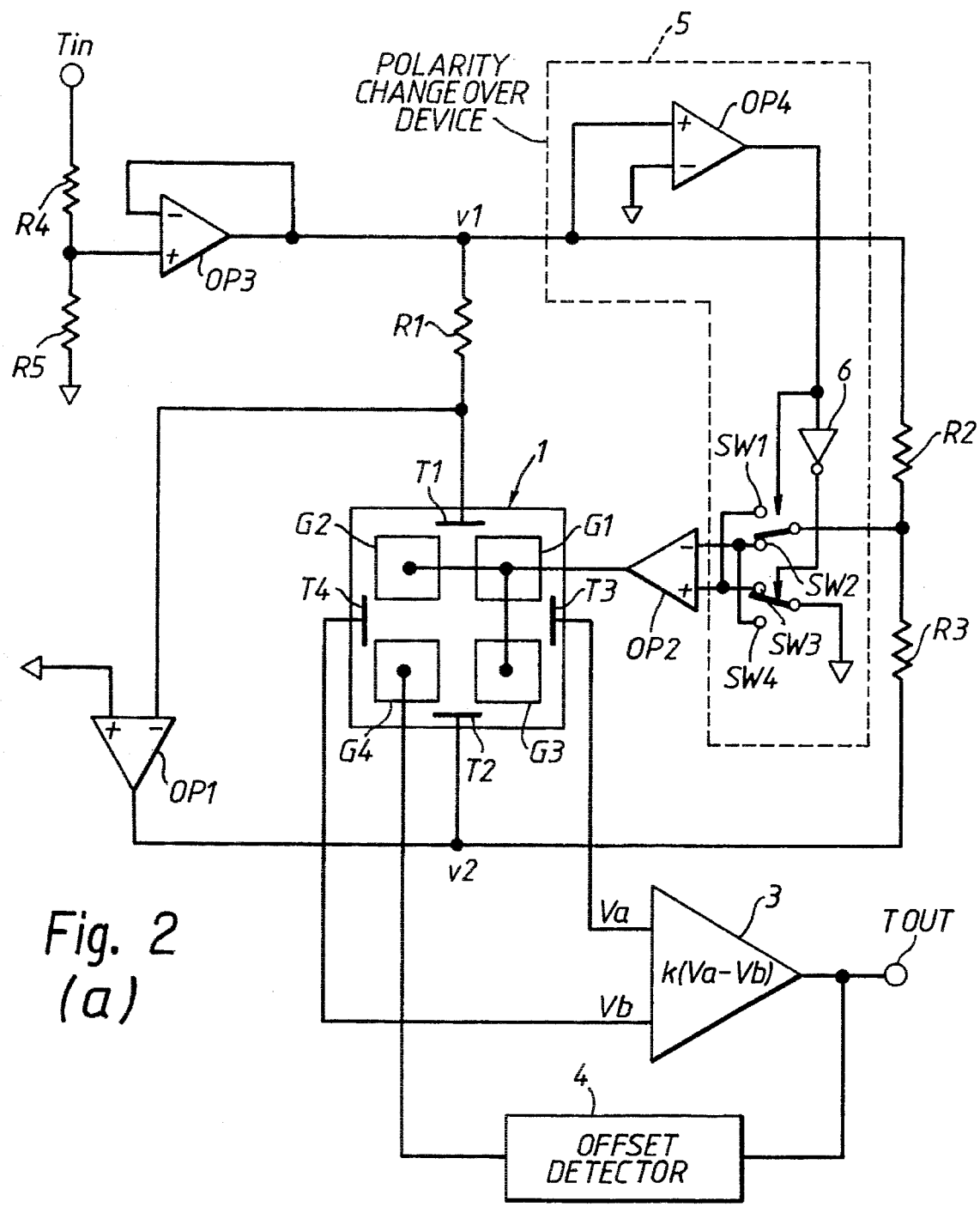
Figure 3:
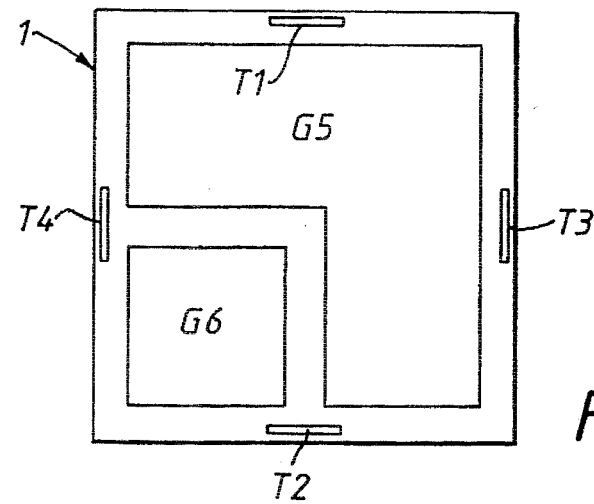
Figure 4:
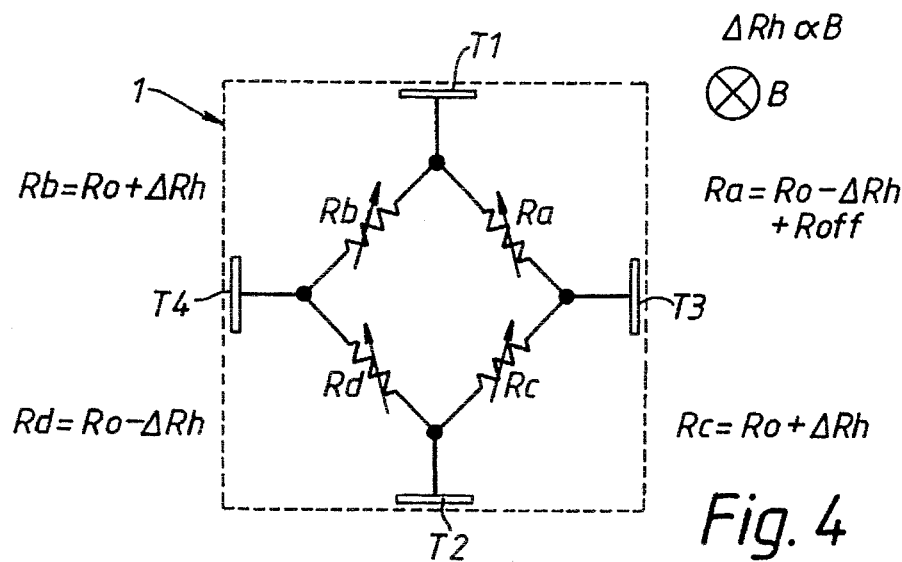

FIG. 2 is a circuit diagram showing a power measurement device according to a second embodiment of this invention;

FIG. 3 is a plan view showing a modified example of gate arrangement on a Hall element in the above first and second embodiments;

FIG. 4 is a view showing an equivalent circuit of a Hall element; and

Figure 5:
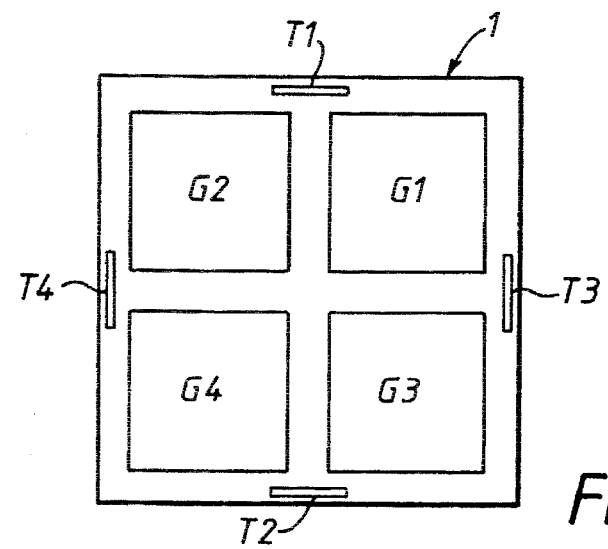

FIG. 5 is a view showing an example of gate arrangement of a Hall element.

DETAILED DESCRIPTION OF THE PREFERRED EMBODIMENTS

Referring now to the drawings, wherein like reference numerals designate identical or corresponding parts throughout the several views, the embodiments of this invention will be described below.

Figure 1:
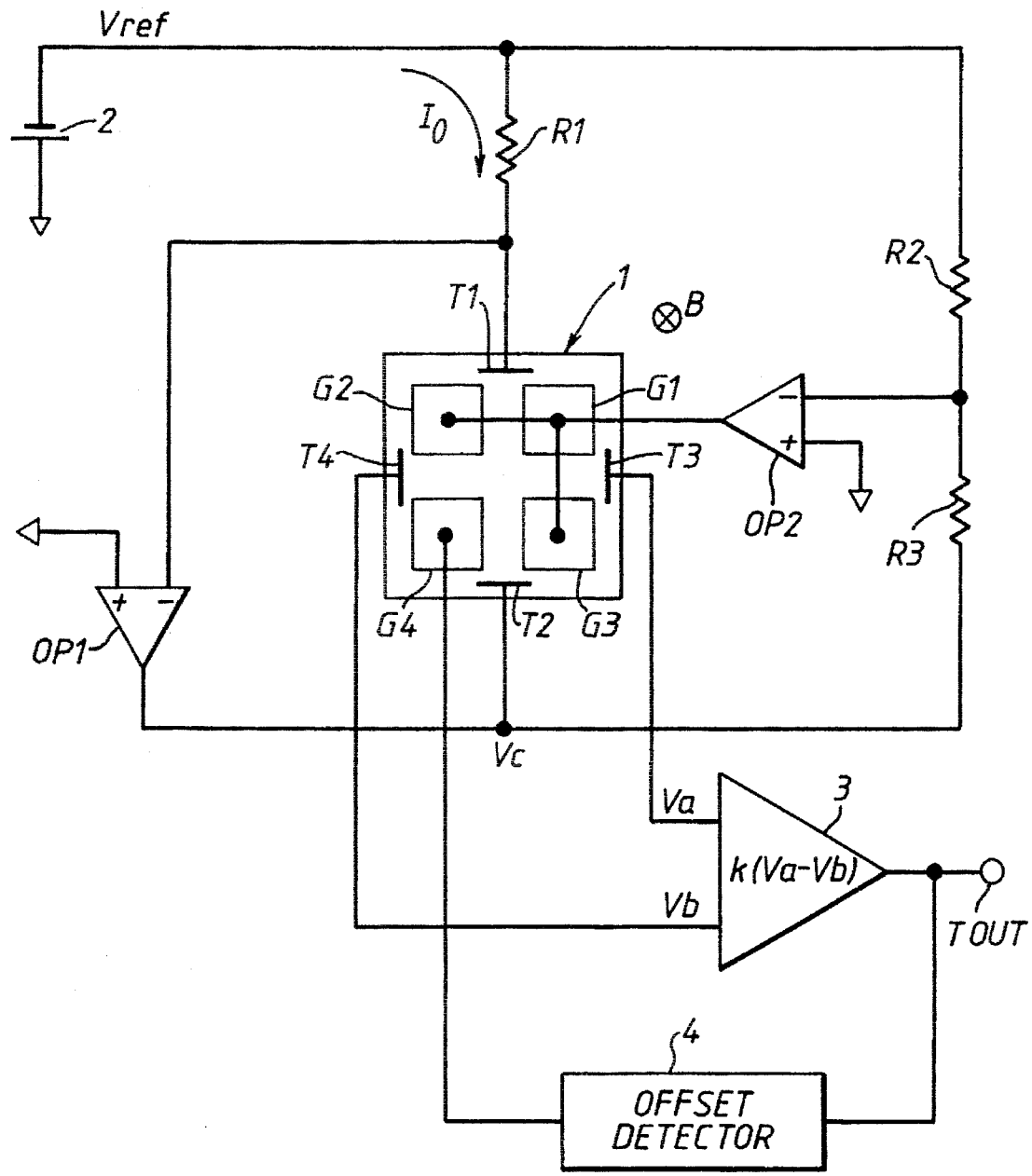
FIG. 1 is a circuit diagram showing a current measurement device according to a first embodiment of this invention.

FIG. 1 is a view illustrating a current measurement device according to a first embodiment of this invention. In FIG. 1 is Hall element fitted with gates G1–G4 just as shown in FIG. 5 above. B is an applied magnetic field, which is directly proportional to the current value of the system under measurement and is obtained by conversion by means of a core or the like. 2 is a constant-voltage source that generats a constant-value DC voltage Vref, and is connected to current input terminal T1 in Hall element 1 through a resistor R1. Current input terminal T1 is also connected to an inverting input terminal of a first operational amplifier OP1, which has the function of maintaining this current input terminal T1 at ground level. A non-inverting input terminal of first operational amplifier OP1 is connected to ground level and its output terminal is connected to the other current input terminal T2. Constant-voltage source 2, resistor R1 and first operational amplifier OP1 constitute current supply means that causes a constant-value DC current IO (IO=Vref/R1) to flow between a pair of current input terminals T1, T2. 3 is a subtractor that amplifies a difference (Va–Vb) of the Hall voltages Va and Vb generated across a pair of voltage output terminals T3, T4 in Hall element 1 by a factor k and outputs this to output terminal Tout. Voltage difference (Va–Vb) is a value directly proportional to the current value of the system under measurement, so the current value of the system under measurement can be measured by reading the output voltage of output terminal Tout. 4 is an offset detector that detects the offset appearing at voltage output terminals T3, T4 through subtractor 3, and executes feedback control to compensate the offset by applying a compensation voltage to gate G4. In more detail, the offset is detected as follows: magnetic flux B applied to Hall element 1 is set to be zero and the voltage appearing at voltage output terminals T3, T4 is detected as the offset through subtractor 3 in this condition. Offset compensation means is constituted by offset detector 4 and Gate G4. Input resistance control means for maintaining input resistance Rin (resistance between a pair of current input terminals T1, T2) at a constant value by varying the remaining three equivalent resistances, when offset compensation is performed by varying one equivalent resistance by means of this offset compensation means, is constructed as follows. Specifically, two resistors R2, R3 are connected in series between the connection point of constant-voltage source 2 and resistor R1 and current input terminal T2; the connection point of these two resistors R2, R3 is connected to an inverting input terminal of a second operational amplifier OP2. A non-inverting input terminal of second operational amplifier OP2 is connected to ground level and its output terminal is connected in common to

4 gates G1, G2, and G3. Second operational amplifier OP2 controls the voltages applied to gates G1, G2, G3 such that the constant voltage Vref from constant-voltage source 2 and a voltage Vc generated across a pair of current input terminals T1, T2 caused by the flow of constant-value DC current IO are in the following relationship:

$$|Vref|/R2=|Vc|/R3 \qquad (1)$$

Input resistance control means is constituted by second operational amplifier OP2, resistors R2, R3 and gates G1, G2, G3.

The description of the construction of FIG. 1 is given with DC voltage Vref assumed to be a negative voltage and in the assumption such that when the control voltages of gates G1–G4 are reduced the resistance values of equivalent resistances Ra–Rd get lower.

The operation of the current measurement device constructed as above will now be described. The resistance values of equivalent resistances Ra–Rd are changed by an amount ΔRh by the application of magnetic field B as shown in FIG. 4. In the ideal condition, in which the amount of offset resistance Roff is zero, input resistance Rin (=(Ra+Rc)∥(Rb+Rd)) will be a constant resistance value Ro, and this is constant irrespective of the intensity of magnetic field B. Control can therefore be achieved such as to maintain input resistance Rin constant even during the application of the magnetic field. When, on detection of an offset by offset detector 4, this offset is compensated to zero by varying a single equivalent resistance by application of compensation voltage to gate G4. At the same time, input resistance Rin is maintained at a constant value by operation of the input resistance control means as follows.

Constant voltage |Vref| in expression (1) is:

$$|Vref|=|IO|\cdot R1|IO|=|Vref|/R1 \qquad (2)$$

In contrast, voltage |Vc| generated between a pair of current input terminals T1, T2 by the flow of constant-value DC current IO is:

$$|Vc|=|IO|\cdot Rin \qquad (3)$$

Inserting expression (2) into expression (3), we have:

$$|Vc|=|Vref|\cdot Rin/R1 \qquad (4)$$

By expression (1) and expression (4), the input resistance Rin is controlled to a constant value represented by the following expression:

$$Rin=R1\cdot R3/R2 \qquad (5)$$

In this way, fluctuation of sensitivity can be eliminated since the input resistance Rin is maintained at a constant value even through one of the equivalent resistance is being varied in such a way as to compensate the offset, which fluctuates due to its temperature characteristic and time-wise variation characteristic, to zero.

FIG. 2 shows a power measurement device according to a second embodiment of this invention. In FIG. 2, Tin is a voltage input terminal that inputs a voltage of the system under measurement. Typically a voltage, such as AC 100 V, is input. Resistors R4 and R5 constitute an attenuator that converts the voltage of the system under measurement to a level matched to the internal circuitry of the device. A third operational amplifier OP3 acts as a buffer and outputs a voltage v1 that is directly proportional to the voltage of the system under measurement. Voltage v1 is a fluctuating AC or DC voltage. The current value of the system under measurement is applied to Hall element 1 by being converted to a magnetic field B by a core or the like in the same way as described above. First operational amplifier OP1 serves as current supply means which supplies a current that is directly proportional to the value of the voltage of the system under measurement between a pair of current input terminals T1, T2. 5 is a polarity changeover device that is arranged so as to provide negative feedback of the input to second operational amplifier OP2 when voltage v1 is an AC voltage. Polarity changeover device 5 is constituted by a fourth operational amplifier OP4 functioning as a comparator, an inverter 6 and switches SW1–SW4. Polarity changeover device 5 changes over the intermediate connection point of resistors R2, R3 and the ground level so as to connect to an inverting input terminal and a non-inverting input terminal of second operational amplifier OP2 by turning ON or OFF switches SW1–SW4 as shown in FIG. 2(b) in accordance with whether voltage v1 is positive or negative.

In this case, voltage difference (Va–Vb) is a value directly proportional to the product of the current value and the voltage value of the system under measurement, so the power value of the system under measurement can be measured by reading the output voltage of output terminal Tout.

with the construction as described above, input resistance control means constituted by second operational amplifier OP2 controls input resistance Rin to a constant value in accordance with the following expression in the same way as in the case of the first embodiment described above, irrespective of whether voltages v1 and a voltage v2 of current input terminal T2 are AC or DC.

$$Rin=R1 \cdot R3/R2$$

As a result, fluctuation in sensitivity can be eliminated even if one equivalent resistance is varied such as to make the offset zero in the same way as in the first embodiment described above.

It may be noted that, in the first and second embodiments as described above, in performing input resistance control, three equivalent resistances are controlled by applying the same voltage to three gates G1, G2, and G3. So, it may be possible to prepare a Hall element 1 as shown in FIG. 3, which is provided with an offset compensation gate G6 and an input resistance control gate G5 which combines the three gates G1, G2, and G3 into one on Hall element 1.

The electrical quantity measurement device according to this invention is constructed as described above. Consequently, when fluctuation in the offset occurs due to the time-wise variation characteristic etc., fluctuation in sensitivity can be suppressed by holding the input resistance at a constant value even though compensation of this offset is being effected. As a result, the measurement of an electrical quantity such as a current or a power of the system under measurement can be performed with high accuracy and with a good temperature characteristic as well.

Obviously, numerous modifications and variations of the present invention are possible in light of the above teachings. It is therefore to be understood that within the scope of the appended claims, the invention may be practiced otherwise than as specifically described herein.

What is claimed is:

1. A device for measuring an electrical quantity of a system under measurement, comprising:

a Hall element equipped with a pair of current input terminals and a pair of voltage output terminals, four equivalent resistances being formed between two adjacent terminals of said current input terminals and said voltage output terminals;

magnetic field applying means for applying a magnetic field proportional to a value of a first current on said Hall element;

current supply means for flowing a second current between said pair of said current input terminals of said Hall element;

output means for detecting a first voltage appearing between said pair of said output voltage terminals and outputting said first voltage as a measured value corresponding to said electrical quantity;

offset compensation means for detecting an offset appearing between said pair of said voltage output terminals for varying one of said four equivalent resistances in said Hall element based on said offset thus detected so as to compensate said offset; and input resistance control means for varying remaining three of said equivalent resistances other than said one equivalent resistance such that a second voltage generated between said pair of said current input terminals caused by a flow of said second current is maintained at a predetermined value;

whereby an input resistance value of said Hall element being held constant.

2. The device according to claim 1, wherein:

in said magnetic field applying means said first current is a current of said system under measurement;

said current supply means flows a constant-value DC current as said second current;

said output means outputs said first voltage as said measured value corresponding to said current of said system under measurement; and said input resistance control means controls such that said second voltage generated between said pair of said current input terminals caused by said flow of said constant-value DC current is maintained at said predetermined value;

whereby said device functioning as a current measurement device.

3. The device according to claim 2, wherein:

said current supply means includes a constant-voltage source for generating a constant-value DC voltage, a first resistor connected between an output terminal of said constant-voltage source and one of said pair of said current input terminals, and a first operational amplifier, an inverted input terminal of said first operational amplifier being connected to said one of said pair of said current input terminals, a non-inverting input terminal of said first operational amplifier being connected to a ground level, and an output terminal of said first operational amplifier being connected to the other of said pair of said current input terminals; and said input resistance control means includes a second resistor, a third resistor and a second operational amplifier, said second resistor being connected between said output terminal of said constant-voltage source and an inverted input terminal of said second operational amplifier, said third resistor being connected between said inverted input terminal of said second operational amplifier and said other of said pair of said current input terminals, a non-inverting input terminal of said second operational amplifier being connected to said ground level and an output terminal of said second operational amplifier being connected to said Hall element for varying said remaining three of said equivalent resistances.

4. The device according to claim 1, wherein:

in said magnetic field applying means said first current is a current of said system under measurement;

said current supply means flows a current proportional to a value of a voltage of said system under measurement as said second current;

said output means outputs said first voltage as said measured value corresponding to a power of said system under measurement; and said input resistance control means controls such that said second voltage generated between said pair of said current input terminals caused by said flow of said current proportional to said value of said voltage of said system under measurement is maintained in a fixed relationship with said value of said voltage of said system under measurement;

whereby said device functioning as a power measurement device.

5. The device according to claim 4, wherein:

said current supply means includes voltage generating means for generating a third voltage proportional to said voltage of said system under measurement, a first resistor connected between an output terminal of said voltage generating means and one of said pair of said current input terminals, and a first operational amplifier, an inverted input terminal of said first operational amplifier being connected to said one of said pair of said current input terminals, a non-inverting input terminal of said first operational amplifier being connected to a ground level, and an output terminal of said first operational amplifier being connected to the other of said pair of said current input terminals; and said input resistance control means includes a second resistor, a third resistor, a second operational amplifier, and polarity changeover means, said second resistor being connected between said output terminal of said voltage generating means and an input terminal of said polarity changeover means, said third resistor being connected between said input terminal of said polarity changeover means and said other of said pair of said current input terminals, said polarity changeover means being connected to said output terminal of said voltage generating means to receive said third voltage and for changing over the connection of said input terminal of said polarity changeover means and a ground level to an inverted input terminal and a non-inverting input terminal of said second operational amplifier based on a polarity of said third voltage, and an output terminal of said second operational amplifier being connected to said Hall element for varying said remaining three of said equivalent resistances.

6. The device according to claim 3 or claim 5, wherein:

said Hall element is further equipped with four gates, values of said equivalent resistances being controlled by applying voltages to said gates;

said offset compensation means varies said one of said four equivalent resistances by applying a compensation voltage to one of said gates based on said offset thus detected so as to compensate said offset; and said input resistance control means varies said remaining three of said equivalent resistances by connecting said output terminal of said second operational amplifier to remaining three of said gates.

7. The device according to claim 3 or claim 5, wherein:

said Hall element is further equipped with an offset compensation gate and an input resistance control gates, one value and remaining three values of said equivalent resistances being controlled by applying voltages to said compensation gate and said input resistance control gate, respectively;

said offset compensation means varies said one of said four equivalent resistances by applying a compensation voltage to said compensation gate based on said offset thus detected so as to compensate said offset; and said input resistance control means varies said remaining three of said equivalent resistances by connecting said output terminal of said second operational amplifier to said input resistance control gate.

* * * * *